United States Patent
Udaka et al.

(10) Patent No.: US 9,680,104 B2
(45) Date of Patent: Jun. 13, 2017

(54) PHOTOELECTRIC CONVERSION DEVICE, SOLID-STATE IMAGE PICKUP UNIT, AND ELECTRONIC APPARATUS INCLUDING TERNARY SYSTEM OF ORGANIC SEMICONDUCTORS

(71) Applicant: SONY CORPORATION, Tokyo (JP)

(72) Inventors: Toru Udaka, Kanagawa (JP); Masaki Murata, Tokyo (JP); Osamu Enoki, Kanagawa (JP); Masayoshi Aonuma, Kanagawa (JP); Sae Miyaji, Kanagawa (JP); Takuya Ito, Kanagawa (JP); Miki Sudou, Kanagawa (JP); Rui Morimoto, Kanagawa (JP); Hiroto Sasaki, Tokyo (JP)

(73) Assignee: Sony Corporation, Tokyo (JP)

( * ) Notice: Subject to any disclaimer, the term of this patent is extended or adjusted under 35 U.S.C. 154(b) by 84 days.

(21) Appl. No.: 14/439,416

(22) PCT Filed: Oct. 31, 2013

(86) PCT No.: PCT/JP2013/079528
§ 371 (c)(1),
(2) Date: Apr. 29, 2015

(87) PCT Pub. No.: WO2014/073446
PCT Pub. Date: May 15, 2014

(65) Prior Publication Data
US 2015/0311445 A1    Oct. 29, 2015

(30) Foreign Application Priority Data

Nov. 9, 2012    (JP) ................................. 2012-247207

(51) Int. Cl.
*H01L 29/08*    (2006.01)
*H01L 51/00*    (2006.01)
(Continued)

(52) U.S. Cl.
CPC ........ *H01L 51/0046* (2013.01); *H01L 27/307* (2013.01); *H01L 51/0068* (2013.01);
(Continued)

(58) Field of Classification Search
CPC ............. H01L 51/0046; H01L 51/0068; H01L 51/0072; H01L 51/0078; H01L 51/4253; H01L 27/1259
See application file for complete search history.

(56) References Cited

U.S. PATENT DOCUMENTS 5,350,459 A * 9/1994 Suzuki ................ H01L 51/0053
136/263
2008/0116536 A1 5/2008 Forrest et al.
(Continued)

FOREIGN PATENT DOCUMENTS

JP    6-177410 A    6/1994
JP    2005-255880 A    9/2005
(Continued)

OTHER PUBLICATIONS

International Search Report prepared by the Japanese Patent Office on Dec. 4, 2013, for International Application No. PCT/JP2013/079528.
(Continued)

*Primary Examiner* — Matthew Gordon
(74) *Attorney, Agent, or Firm* — Sheridan Ross P.C.

(57) ABSTRACT

A solid-state image pickup unit of the invention includes a plurality of pixels, each of which includes a photoelectric conversion element. The photoelectric conversion element includes a photoelectric conversion layer; and first and second electrodes provided with the photoelectric conversion layer in between, the photoelectric conversion layer including a first organic semiconductor of a first conductive type and a second organic semiconductor of a second
(Continued)

conductive type, and being configured by addition of a third organic semiconductor made of a derivative or an isomer of one of the first and second organic semiconductors.

14 Claims, 11 Drawing Sheets

(51) Int. Cl.
*H01L 27/30* (2006.01)
*H01L 51/42* (2006.01)

(52) U.S. Cl.
CPC ...... *H01L 51/0072* (2013.01); *H01L 51/0078* (2013.01); *H01L 51/4253* (2013.01); *H01L 51/4246* (2013.01); *Y02E 10/549* (2013.01)

(56) References Cited

U.S. PATENT DOCUMENTS

| | | | |
|---|---|---|---|
| 2010/0127244 A1* | 5/2010 | Kronholm | B82Y 10/00 257/40 |
| 2010/0193777 A1* | 8/2010 | Takahashi | B82Y 10/00 257/40 |

FOREIGN PATENT DOCUMENTS

| | | |
|---|---|---|
| JP | 2008-38061 A | 2/2008 |
| JP | 2011-77361 A | 4/2011 |
| JP | 2011-187918 | 9/2011 |
| JP | 2011-198856 A | 10/2011 |
| WO | WO 2008/006071 | 1/2008 |
| WO | WO 2011/030411 | 3/2011 |

OTHER PUBLICATIONS

Kim et al., "Effect of molecular packing on interfacial recombination of organic solar cells based on palladium phthalocyanine and perylene derivatives." Allied Physics Letters, 2009, vol. 95, Iss. 2, pp. 23305(1-3).

Mishra et al, "Small Molecule Organic Semiconductors on the Move: Promises for Future Solar Energy Technology," Angewandte Chemie International Edition, 2012, vol. 51, No. 9, pp. 2020-2067.

Yang et al., "Parallel-like Bulk Heterojunction Polymer Solar Cells," Journal of the American Chemical Society, 2012, vol. 134, Iss. 12, pp. 5432-5435.

Extended European Search Report for European Patent Application No. 13853391.4 dated Jun. 17, 2016, 11 pages.

Official Action (no English translation available) for Chinese Patent Application No. 201310536129.X dated Aug. 12, 2016, 6 pages.

* cited by examiner

COMPARATIVE EXAMPLE 1

COMPARATIVE EXAMPLE 2-1

PHOTOELECTRIC CONVERSION DEVICE, SOLID-STATE IMAGE PICKUP UNIT, AND ELECTRONIC APPARATUS INCLUDING TERNARY SYSTEM OF ORGANIC SEMICONDUCTORS

CROSS REFERENCE TO RELATED APPLICATIONS

This application is a national stage application under 35 U.S.C. 371 and claims the benefit of PCT Application No. PCT/JP2013/079528 having an international filing date of Oct. 31, 2013, which designated the United States, which PCT application claimed the benefit of Japanese Patent Application No. 2012-247207 filed Nov. 9, 2012, the disclosures of which are incorporated herein by reference in their entirety.

TECHNICAL FIELD

The present disclosure relates to a photoelectric conversion device using an organic photoelectric conversion material, and a solid-state image pickup unit and an electronic apparatus that include such a photoelectric conversion device as a pixel.

BACKGROUND ART

As a solid-state image pickup unit such as a CCD (Charge Coupled Device) image sensor or a CMOS (Complementary Metal Oxide Semiconductor) image sensor, a solid-state image pickup unit using a photoelectric conversion layer made of an organic semiconductor for each pixel has been proposed (for example, PTL 1).

CITATION LIST

Patent Literature

PTL 1: Japanese Unexamined Patent Application Publication No. 2011-187918

SUMMARY OF INVENTION

Incidentally, since organic semiconductors are poor in heat resistance, performance of the photoelectric conversion layer is easily deteriorated by high-temperature heat treatment during a manufacturing process. Therefore, in the above-described PTL 1, to prevent deterioration in performance caused by high-temperature heat treatment (200° C. or more), an intermediate layer made of an organic compound with a glass-transition temperature of 200° C. or more is provided between the photoelectric conversion layer and an electrode. However, interposition of such an intermediate layer causes degradation in quantum efficiency, and also causes degradation in flexibility in material selection of organic semiconductors. Therefore, it is desirable to achieve a technique of suppressing deterioration in performance of the photoelectric conversion layer caused by heat treatment without providing such an intermediate layer.

Therefore, it is desirable to provide a photoelectric conversion device, a solid-state image pickup unit, and an electronic apparatus that are capable of suppressing deterioration in performance of a photoelectric conversion layer caused by heat treatment.

A photoelectric conversion device according to an embodiment of the present disclosure includes: a photoelectric conversion layer including a first organic semiconductor of a first conductive type and a second organic semiconductor of a second conductive type, and being configured by addition of a third organic semiconductor made of a derivative or an isomer of one of the first and second organic semiconductors; and first and second electrodes provided with the photoelectric conversion layer in between.

A solid-state image pickup unit according to an embodiment of the present disclosure is provided with a plurality of pixels each of which includes the above-described photoelectric conversion device according to the embodiment of the present disclosure.

An electronic apparatus according to an embodiment of the present disclosure is provided with the above-described solid-state image pickup unit according to the embodiment of the present disclosure.

In the photoelectric conversion device, the solid-state image pickup unit, and the electronic apparatus according to the embodiments of the present disclosure, the photoelectric conversion layer includes the first organic semiconductor of the first conductive type and the second organic semiconductor of the second conductive type, and is configured by addition of a derivative or an isomer of one of them. Therefore, aggregation of the first or second organic semiconductor in high-temperature heat treatment of a manufacturing process is inhibited.

According to the photoelectric conversion device, the solid-state image pickup unit, and the electronic apparatus of the embodiments of the present disclosure, the photoelectric conversion layer includes the first organic semiconductor of the first conductive type and the second organic semiconductor of the second conductive type, and is configured by addition of a derivative or an isomer of one of them. Therefore, aggregation of the first or second organic semiconductor in high-temperature heat treatment of the manufacturing process is allowed to be inhibited, thereby reducing variation in film quality in the photoelectric conversion layer. Accordingly, deterioration in performance of the photoelectric conversion layer caused by heat treatment is allowed to be suppressed.

DESCRIPTION OF EMBODIMENTS

Some embodiments of the present disclosure will be described in detail below referring to the accompanying drawings. It is to be noted that description will be given in the following order.
1. Embodiment (An example of a photoelectric conversion device configured by addition of a derivative of an n-type organic semiconductor to a photoelectric conversion layer including a p-type organic semiconductor and the n-type organic semiconductor)
2. Modification Example (An example in a case where another derivative is added)
3. Entire Configuration Example of Solid-state Image Pickup Unit
4. Application Example (An example of an electronic apparatus (camera))

Embodiment

Figure 1:
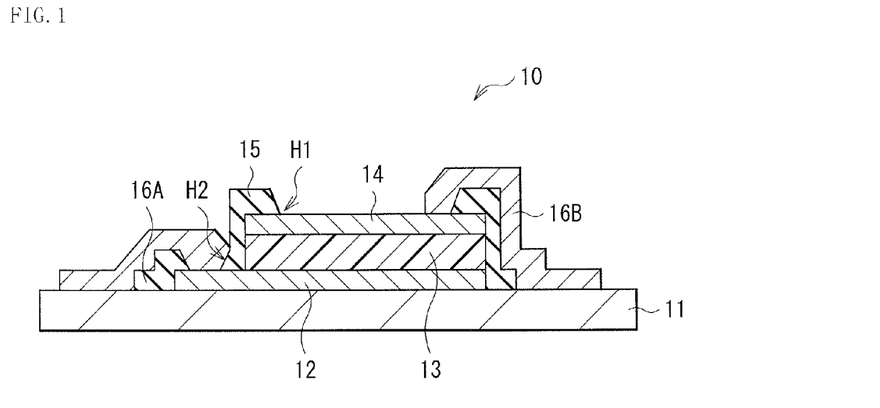
FIG. 1 is a sectional view illustrating a schematic configuration example of a photoelectric conversion device (pixel) according to an embodiment of the present disclosure.

[Configuration]
FIG. 1 illustrates a schematic sectional configuration of a pixel (a photoelectric conversion device 10) in a solid-state image pickup unit according to an embodiment of the present disclosure. As will be described in detail later, the solid-state image pickup unit may be, for example, a CCD (Charge Coupled Device) or CMOS (Complementary Metal Oxide Semiconductor) image sensor or the like. The photoelectric conversion device 10 may be provided on, for example, a substrate 11 including a pixel transistor and a wiring line, and may be coated with a sealing film, a planarization film, and the like that are not illustrated. For example, an on-chip lens that is not illustrated may be provided on the planarization film.

The photoelectric conversion device 10 is an organic photoelectric conversion device that absorbs light of a selective wavelength (for example, color light of any one of R, G, and B) with use of an organic semiconductor to generate an electron-hole pair. In the solid-state image pickup unit that will be described later, the photoelectric conversion devices 10 (pixels) of these respective colors R, G, and B are two-dimensionally arranged side by side. Alternatively, the photoelectric conversion device 10 may have a configuration in which a plurality of photoelectric conversion layers made of an organic semiconductor are laminated along a vertical direction in one pixel or a configuration in which a photoelectric conversion layer made of an organic semiconductor and a photoelectric conversion layer made of an inorganic semiconductor are laminated along the vertical direction in one pixel. In this embodiment, a main-part configuration of such a photoelectric conversion device will be described referring to FIG. 1.

This photoelectric conversion device 10 includes an organic layer 13 as a photoelectric conversion layer and a pair of electrodes (a lower electrode 12 and the upper electrode 14) for extraction of a signal charge from the organic layer 13 on the substrate 11. The lower electrode 12, the organic layer 13, and the upper electrode 14 are covered with an insulating layer 15 having an opening (a light reception opening) H1. The lower electrode 12 (a first electrode) is electrically connected to a lower contact electrode 16A, and the upper electrode 14 (a second electrode) is electrically connected to an upper contact electrode 16B. For example, in a case where a signal charge is extracted from the lower electrode 12 side, the lower electrode 12 may be electrically connected to a storage layer buried in, for example, the substrate 11 through the lower contact electrode 16A. The lower contact electrode 16A is electrically connected to the lower electrode 12 through an opening (a contact hole) H2 provided in the insulating film 15. A charge (for example, a hole) is emitted from the upper electrode 14 through the upper contact electrode 16B.

The substrate 11 may be made of, for example, silicon (Si). A conductive plug, the storage layer, and the like (that are not illustrated) that serve as a transmission path for a charge (an electron or a hole) extracted from the organic layer 13 are buried in this substrate 11. It is to be noted that, in a case where the organic photoelectric conversion layer and the inorganic photoelectric conversion layer are laminated in one pixel in the above-described manner, the inorganic photoelectric conversion layer is so formed as to be buried in this substrate 11.

The lower electrode 12 may be made of, for example, a simple substance or an alloy of a metal element such as aluminum (Al), chromium (Cr), gold (Au), platinum (Pt), nickel (Ni), copper (Cu), tungsten (W), or silver (Ag). Alternatively, the lower electrode 12 may be configured of, for example, a transparent conductive film such as ITO (indium tin oxide). As the transparent conductive film, in addition to ITO, tin oxide (TO), a tin oxide ($SnO_2$)-based material doped with a dopant, or a zinc oxide-based material prepared by doping zinc oxide (ZnO) with a dopant may be used. Examples of the zinc oxide-based material may include aluminum zinc oxide (AZO) doped with aluminum (Al) as a dopant, gallium zinc oxide (GZO) doped with gallium (Ga), and indium zinc oxide (IZO) doped with indium (In). Moreover, in addition to them, CuI, $InSbO_4$, ZnMgO, $CuInO_2$, $MgIN_2O_4$, CO, $ZnSnO_3$, or the like may be used. It is to be noted that, in a case where a signal charge (an electron) is extracted from the lower electrode 12 in the above-described manner, in the solid-state image pickup unit that uses the photoelectric conversion device 10 as a pixel and will be described later, the lower electrodes 12 are provided separately for respective pixels.

The insulating film 15 may be configured of a single-layer film made of one kind selected from silicon oxide, silicon nitride, silicon oxynitride (SiON), and the like or a laminate film made of two or more kinds selected from them, for example. In a case where the photoelectric conversion devices 10 are used as pixels of the solid-state image pickup unit, these insulating films 15 have a function of electrically separating the lower electrodes 12 of the respective pixels from one another.

(Organic Layer 13)
The organic layer 13 is configured to include p-type (first conductive type) and n-type (second conductive type) organic semiconductors that absorb light in a selective wavelength range to perform photoelectric conversion. As the p-type organic semiconductor and the n-type organic semiconductor, various organic pigments are adopted, and examples of the organic semiconductors may include a quinacridone derivative (quinacridones such as quinacridone, dimethylquinacridone, diethylquinacridone, dibutylquinacridone, and dihalogen quinacridone such as dichloroquinacridone) and a phthalocyanine derivative (phthalocyanine, SubPC, CuPC, ZnPC, H2PC, and PbPC). Moreover, in addition to them, an oxadiazole derivative (NDO and PBD), a stilbene derivative (TPB), a perylene derivative (PTCDA, PTCDI, PTCBI, and Bipyrene), a tetracyanoquinodimethane derivative (TCNQ and F4-TCNQ), and a phenanthroline derivative (Bphen, Anthracene, Rubrene, and Bianthrone) are adopted. However, in addition to them, for example, a naphthalene derivative, a pyrene derivative, and a fluoranthene derivative may be used. Alternatively, a polymer such as phenylenevinylene, fluorene, carbazole, indole, pyrene, pyrrole, picoline, thiophene, acetylene, or diacetylene, or a derivative thereof may be used. In addition, a metal complex dye, a rhodamine-based dye, a cyanine-based dye, a merocyanine-based dye, a phenylxanthene-based dye, a triphenylmethane-based dye, a rhodacyanine-based dye, a xanthene-based dye, a macrocyclic azaannulene-based dye, an azulene-based dye, naphthoquinone, an anthraquinone-based dye, a chain compound prepared by condensing a condensed polycyclic aromatic group such as anthracene or pyrene and an aromatic ring or a heterocyclic compound, quinoline having a squarylium group and a croconic methine group as a joining chain, two nitrogen-containing heterocyclic rings such as benzothiazole and benzoxazole, a cyanine-like dye bonded by a squarylium group and a croconic methine group, or the like may be preferably used. It is to be noted that, as the above-described metal complex dye, an aluminum complex (Alq3 and Balq), a dithiol metal complex-based dye, a metal phthalocyanine dye, a metal porphyrin dye, or a ruthenium complex dye may be preferable; however, the metal complex dye is not limited thereto. Moreover, in the organic layer 13, in addition to the above-described pigments, other organic materials such as fullerene (C60) and BCP (Bathocuproine) may be laminated as an electrode configuration adjustment layer.

This organic layer 13 includes two kinds selected from the above-described materials as the p-type organic semiconductor and the n-type organic semiconductor (hereinafter referred to as "organic semiconductors A and B", respectively) and is formed by adding a predetermined amount of an analog (a derivative or an isomer) (hereinafter referred to as "organic semiconductor C1") to one of them. The organic layer 13 may be, for example, a co-evaporated film (a film formed by a co-evaporation method that will be described later) including these organic semiconductors A, B, and C1. However, the organic layer 13 may be a coating film (a film formed by a coating method that will be described later) or a printing film (a film formed by a printing method that will be described later) including the organic semiconductors A, B, and C1, or a laminate film formed by laminating them. For example, the organic layer 13 may have a configuration in which films of the organic semiconductors A, B, and C1 with a film thickness of about 10 nm or less are alternately laminated. More specifically, the organic semiconductor C1 is an analog of one with a higher aggregation property (that is relatively likely to be aggregated) of the organic semiconductors A and B. As used herein, the term "aggregation property" refers to ease of aggregation at a temperature of, for example, about 150° C. to about 600° C. by an action such as intermolecular force.

In this embodiment, a case where quinacridone (QD) and subphthalocyanine (SubPC) are used as examples of such organic semiconductors A and B will be described below. In this case, in the organic semiconductors A and B, the organic semiconductor A (quinacridone) is relatively likely to be aggregated; therefore, as the organic semiconductor C1, a derivative or an isomer of quinacridone (in this case, dimethylquinacridone that is a derivative) is used. Moreover, based on an ionization potential relationship, the organic semiconductor A (quinacridone) and the organic semiconductor B (subphthalocyanine) function as p-type and n-type organic semiconductors, respectively.

Figure 2:
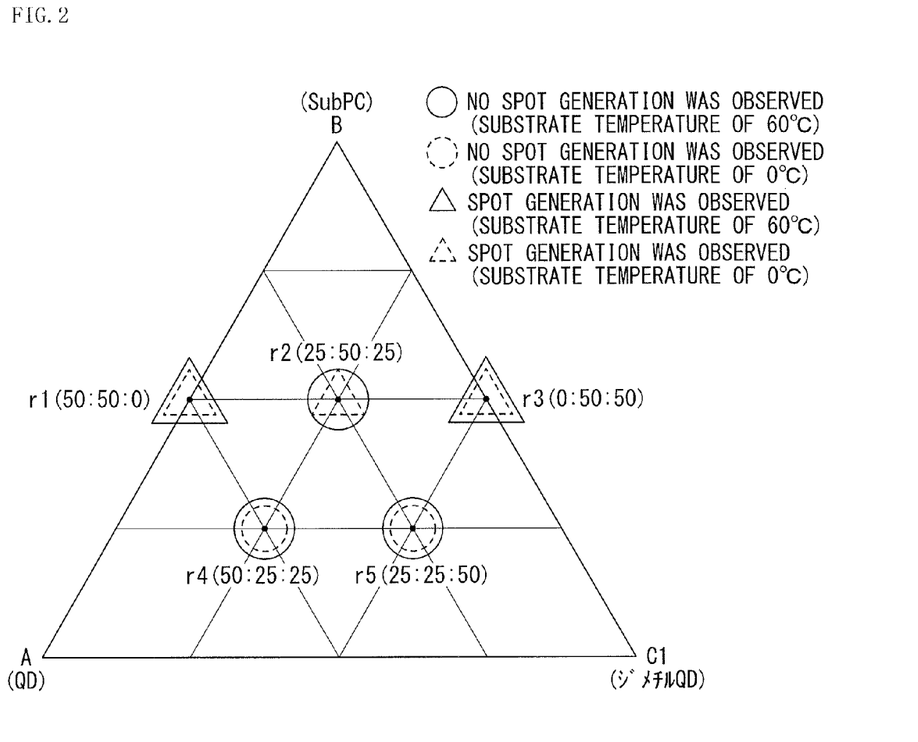
FIG. 2 is a schematic view illustrating an example of a ternary system mixture ratio of organic semiconductors included in a photoelectric conversion layer illustrated in FIG. 1.

FIG. 2 illustrates an example of a ternary system mixture ratio of these organic semiconductors A, B, and C1. FIG. 2 illustrates the ternary system mixture ratios (A:B:C1) of the organic semiconductors A, B, and C1=r1 (50:50:0), r2 (25:50:25), r3 (0:50:50), r4 (50:25:25), and r5 (25:25:50), and presence or absence of a spot (a patchy structure) of the organic layer 13 in these respective cases. It is to be noted that this is based on results of observing sectional surfaces of the organic layers 13 formed by co-evaporating mixtures of the organic semiconductors A, B, and C1 at the above-described mixture ratios r1 to r5 on a quartz substrate (at substrate temperatures of 60° C. and 0° C.) and then performing high-temperature annealing (at about 250° C. for several minutes) to evaluate the presence or absence of spot generation. In each of r1 to r5, a case where spot generation was not observed is indicated by a "circle" mark, and a case where spot generation was observed is indicated by a "triangle" mark. Moreover, these marks are indicated by a solid line in a case of a substrate temperature of 60° C. and are indicated by a broken line in a case of a substrate temperature of 0° C.

Thus, in binary systems (r1 and r3) in which only two kinds selected from the organic semiconductors A, B, and C1 were mixed, at both the substrate temperatures of 60° C. and 0° C., spot generation was observed; however, in ternary systems (r2, r4, and r5) in which three semiconductor materials; i.e., the organic semiconductors A, B, and C1 were mixed, compared to the binary systems, spot generation was inhibited. Moreover, it is found that the lower the concentration of SubPC is, the more a spot inhibition effect is obtained.

For example, the above-described organic layer 13 may be formed on the lower electrode 12 as follows. That is, a mixed liquid including the organic semiconductors A, B, and C1 prepared by further adding the organic semiconductor C1 to a predetermined solvent in which two kinds (the organic semiconductors A and B) of the above-described p-type and n-type organic semiconductor materials are dissolved is adjusted on the lower electrode 12. A mixture ratio of the organic semiconductors A, B, and C1 in the mixed liquid may be, for example, any of mixture ratios indicated by r2, r4, and r5 illustrated in FIG. 2. For example, the organic layer 13 including the organic semiconductors A, B, and C1 at a predetermined mixture ratio may be formed by co-evaporating the mixed liquid adjusted in such a manner. However, in addition to the evaporation method, a film of the above-described mixed liquid may be formed by, for example, various coating methods such as a spin coating method, a slit coating method, and a dip coating method. Moreover, the film may be formed by, for example, various printing methods such as reverse offset printing and relief printing. Alternatively, in a case where the organic layer 13 is formed of a laminate film of the organic semiconductors A, B, and C1, for example, the organic layer 13 may be formed by multistage evaporation in which films of respective solutions containing the respective organic semiconductors A, B, and C1 are sequentially formed by an evaporation method. Alternatively, for example, a solution in which the organic semiconductors A and C1 are mixed and a solution including the organic semiconductor B may be sequentially evaporated.

The upper electrode 14 is configured of a transparent conductive film described as the lower electrode 12. It is to be noted that, in a case where a signal charge is extracted from the lower electrode 12 side as with this embodiment, this upper electrode 14 is provided as a common electrode for the respective pixels.

[Actions and Effects]

In the photoelectric conversion device 10 of this embodiment, for example, as the pixel of the solid-state image pickup unit, a signal charge may be obtained as follows. That is, when light is incident on the photoelectric conversion device 10 through an on-chip lens that is not illustrated, photoelectric conversion is performed on the incident light in the organic layer 13. More specifically, first, an electron-hole pair is generated by selectively detecting (absorbing) predetermined color light (red light, green light, or blue light) by the organic layer 13. For example, while an electron of the electron-hole pair thereby generated is extracted from the lower electrode 12 side to be stored in the substrate 11, a hole of the electron-hole pair is emitted from the upper electrode 14 side through a wiring layer that is not illustrated. Image pickup data of respective colors, i.e., red, green, and blue are obtained by reading light reception signals of respective colors stored in such a manner to a vertical signal line Lsig that will be described later.

Comparative Examples

Figure 3:
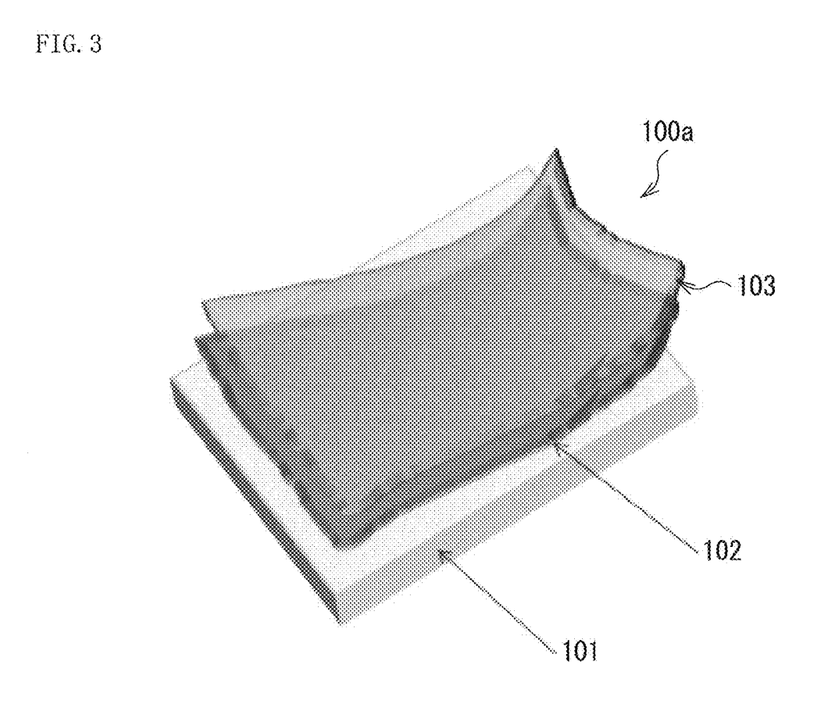
FIG. 3 is a perspective view illustrating a configuration example of a photoelectric conversion device according to Comparative Example 1.
Figure 4:
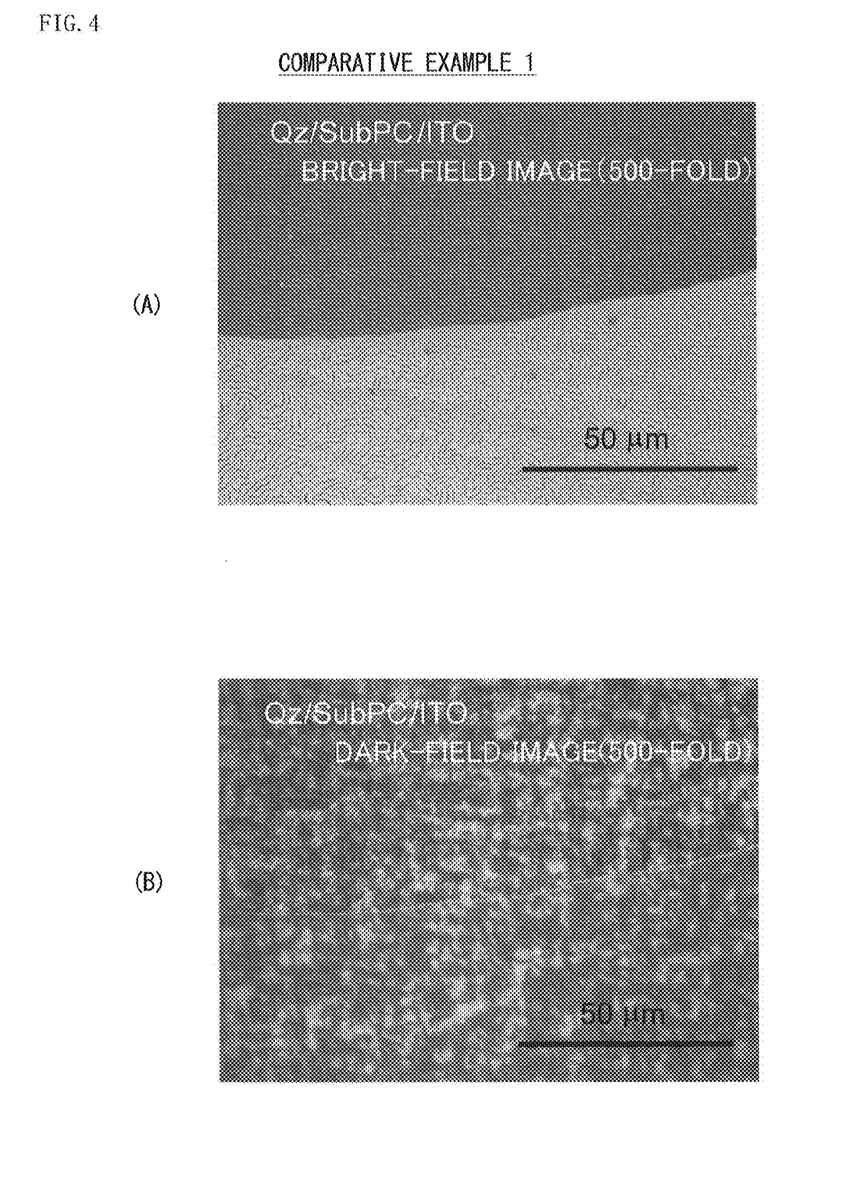
FIG. 4 is an image illustrating a film state after heat treatment of a photoelectric conversion layer illustrated in FIG. 3.

FIG. 3 is a perspective view illustrating a configuration of a sample (a sample 100a) of a photoelectric conversion device according to a comparative example (Comparative Example 1) of this embodiment. As Comparative Example 1, the sample 100a was fabricated by evaporating an organic layer 102 configured of a binary system co-evaporated film of quinacridone and SubPC on a substrate 101 made of quartz, and then forming an electrode 103 made of ITO and performing high-temperature annealing (at about 250° C. for several minutes). Images of a sectional surface of the organic layer 102 of this sample 100a were taken with use of an optical microscope, and a bright-field image and a dark-field image are illustrated in FIGS. 4(A) and 4(B), respectively. Thus, it was found that, in Comparative Example 1 using the organic layer 102 made of the binary system co-evaporated film of quinacridone and SubPC, a structure was formed by material migration, and variation in film quality was caused. Moreover, quinacridone was preferentially aggregated to cause phase separation.

Figure 5:
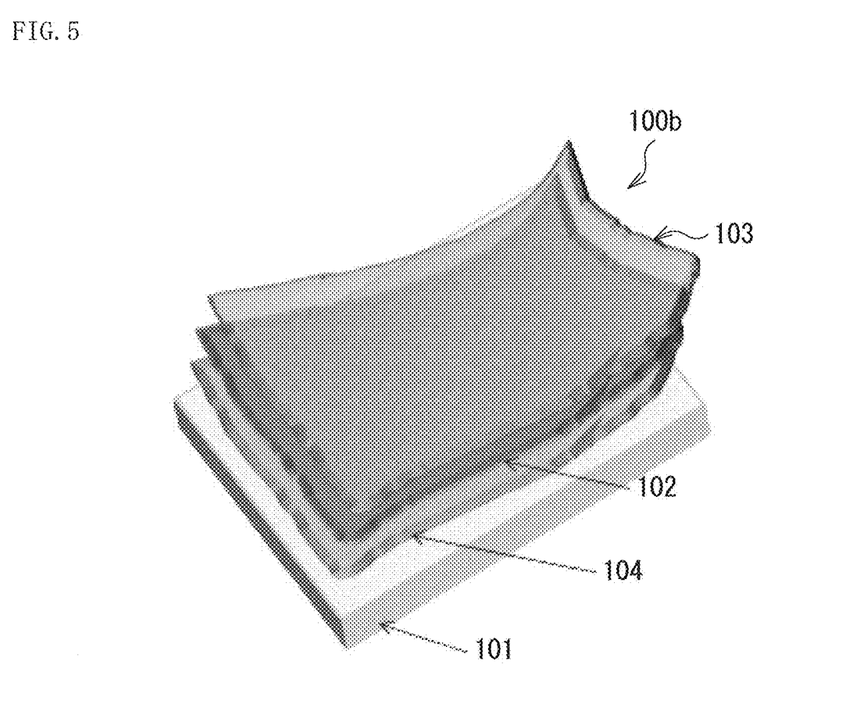
FIG. 5 is a perspective view illustrating a configuration example of a photoelectric conversion device according to Comparative Example 2.
Figure 6:
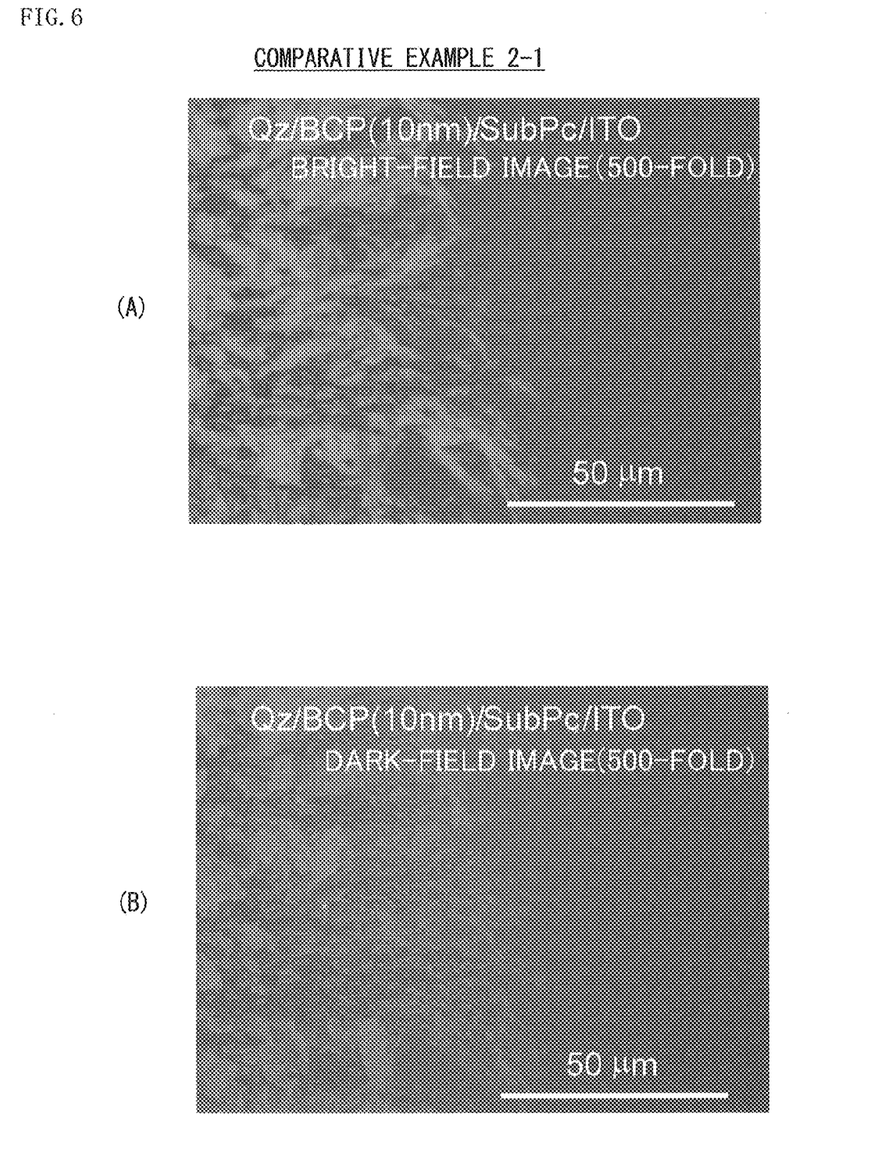
FIG. 6 is an image illustrating a film state after heat treatment of one photoelectric conversion layer (an intermediate layer: BCP) illustrated in FIG. 5.

FIG. 5 is a perspective view illustrating a configuration of a sample (a sample 100b) of a photoelectric conversion device according to a comparative example (Comparative Example 2-1) of this embodiment. As Comparative Example 2-1, the sample 100b was fabricated by evaporating the organic layer 102 (a co-evaporated film of quinacridone and SubPC) on the substrate 101 with an intermediate layer 104 made of BCP (with a low glass transition temperature) in between, and then forming the electrode 103 and performing high-temperature annealing (at about 250° C. for several minutes). Images of a sectional surface of the organic layer 102 of this sample 100b were taken with use of an optical microscope, and a bright-field image and a dark-field image are illustrated in FIGS. 6(A) and 6(B), respectively. Thus, it was found that, even in Comparative Example 2-1 in which the intermediate layer 104 made of BCP was provided between the organic layer 102 and the substrate 101, a spot was generated, and variation in film quality was caused.

Figure 7:
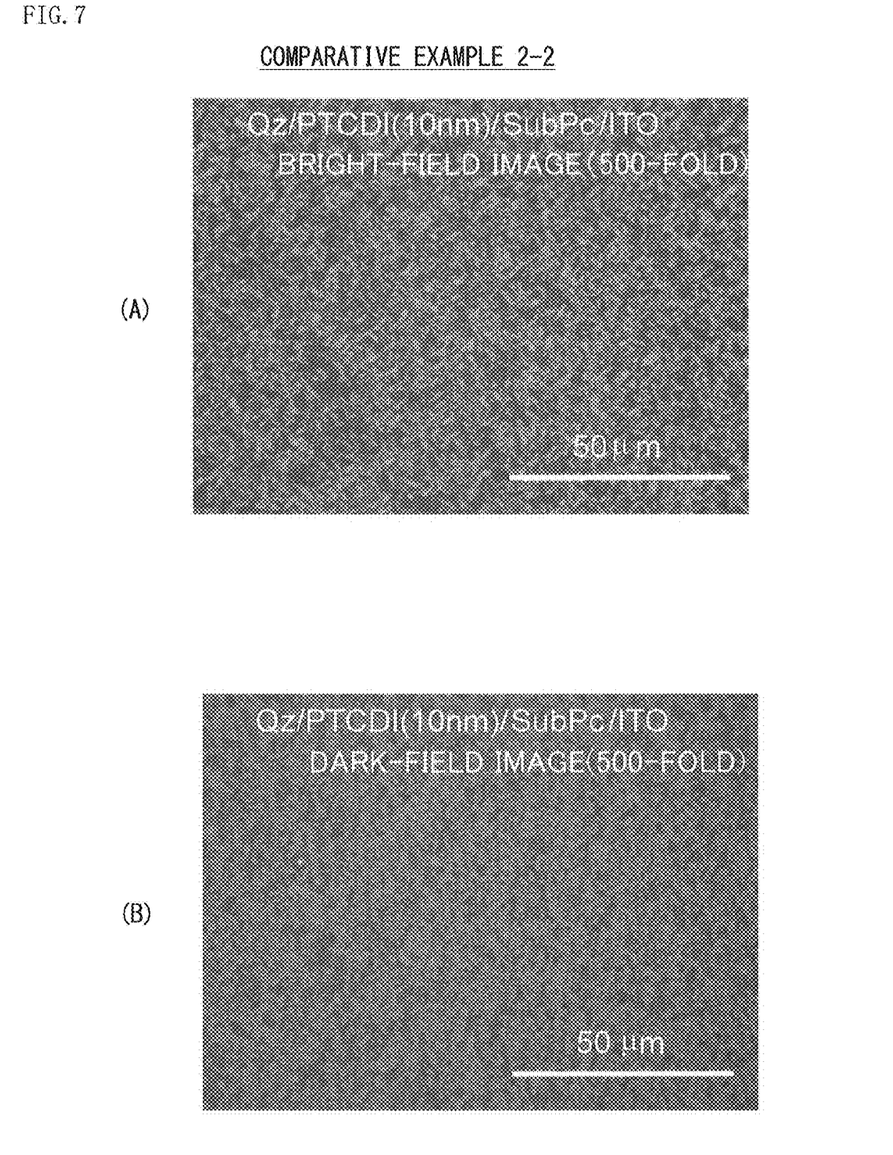
FIG. 7 is an image illustrating a film state after heat treatment of another photoelectric conversion layer (an intermediate layer: PTCDI) illustrated in FIG. 5.

Moreover, as a comparative example (Comparative Example 2-2), images of a sectional surface of the organic layer 102 in a case where PTCDI having a high glass transition temperature was used for the intermediate layer 104 instead of BCP in the above-described sample 100b were taken with use of an optical microscope. A bright-field image and a dark-field image of the sample are illustrated in FIGS. 7(A) and 7(B), respectively. Thus, it was found that, even in Comparative Example 2-2 in which the intermediate layer 104 made of PTCDI was provided between the organic layer 102 and the substrate 101, spot generation was observed, and variation in film quality was caused.

As described above, in the organic layer 102 configured of the co-evaporated film including the p-type organic semiconductor and the n-type organic semiconductor, a spot or the like is generated due to a manufacturing process (high-temperature heat treatment) to cause variation in film quality. It is considered that a cause of this is that one (in this case, quinacridone as the p-type organic semiconductor) of the p-type organic semiconductor and the n-type organic semiconductor is preferentially aggregated to cause phase separation in the organic layer 102.

Figure 8:
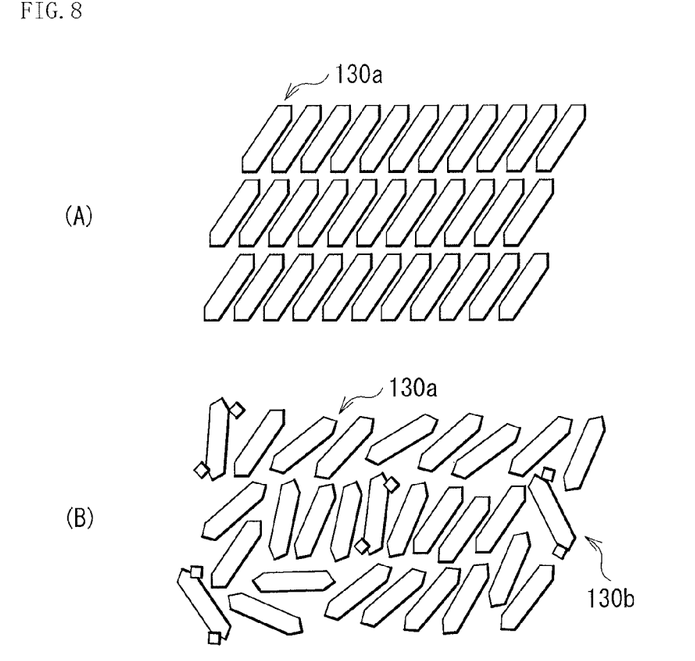
FIG. 8 is a schematic view for describing a principle of aggregation inhibition.

On the other hand, in this embodiment, the organic semiconductor C1 (dimethylquinacridone) as a derivative of the organic semiconductor A is further added to the organic layer 13 including the p-type organic semiconductor A (for example, quinacridone) and the n-type organic semiconductor B (for example, SubPC). When the organic layer 13 further includes, in addition to the p-type and n-type organic semiconductors A and B, a analog (the organic semiconductor C1) of one (the organic semiconductor A) with a higher aggregation property of the organic semiconductors A and B in such a manner, aggregation of the organic semiconductor A is inhibited to reduce spot generation. A cause of this is that a regular arrangement as illustrated in FIG. 8(A) of molecules (QD molecules 130a) of the organic semiconductor A is broken (disturbed) by molecules (dimethyl QD molecules 130b) of the organic semiconductor C1. More specifically, quinacridone molecules are easily aggregated by intermolecular force; however, for example, by using a derivative prepared by arranging methyl groups to positions 2 and 9 of quinacridone, spot generation is inhibited without largely changing electrical characteristics.

Figure 9:
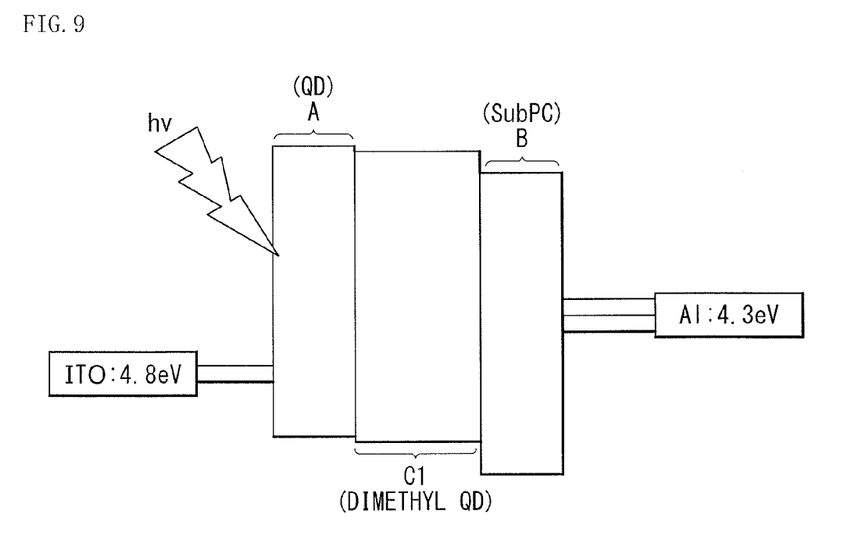
FIG. 9 is a schematic view for describing a principle of improvement in quantum efficiency.
Figure 10:
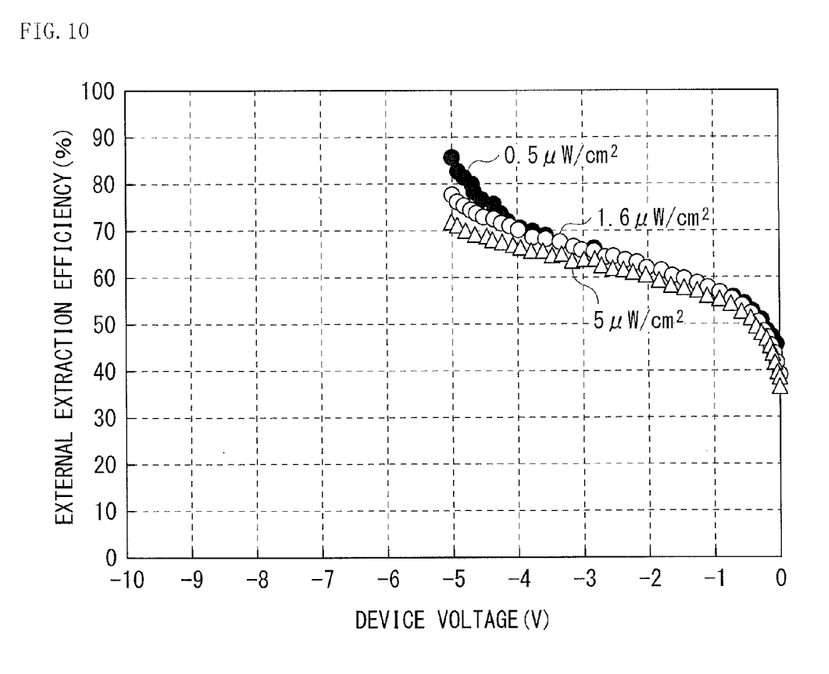
FIG. 10 is a characteristic diagram illustrating a result of improvement in quantum efficiency.

Moreover, FIG. 9 illustrates a band diagram of a device configuration of this embodiment. FIG. 9 illustrates an example in which a ternary system co-evaporated film of the organic semiconductors A, B, and C1 is provided between an electrode made of ITO (with a work function of 4.8 eV) and an electrode made of aluminum (with a work function of 4.3 eV). It is to be noted that an energy level of the highest occupied molecular orbital (HOMO) of quinacridone is about 5.3 eV, and an energy level of the lowest unoccupied molecular orbital (LUMO) of quinocridone is about 3.2 eV. Moreover, an energy level of the highest occupied molecular orbital of SubPC is about 5.4 eV, and an energy level of the lowest unoccupied molecular orbital of SubPC is about 3.3 eV.

As described above, in this embodiment, the organic semiconductor C1 as the derivative of the organic semiconductor A is added to the organic layer 13 including the p-type organic semiconductor A and the n-type organic semiconductor B. Therefore, in high-temperature heat treatment of the manufacturing process, aggregation of the organic semiconductor A is allowed to be inhibited, and variation in film quality in the organic layer 13 is allowed to be reduced.

Therefore, deterioration in performance of the organic layer 13 (the photoelectric conversion layer) caused by heat treatment is allowed to be suppressed.

Next, a modification example of the photoelectric conversion device (pixel) according to the above-described embodiment will be described below. It is to be noted that like components are denoted by like numerals as of the above-described embodiment and will not be further described where appropriate.

Modification Example

Figure 11:
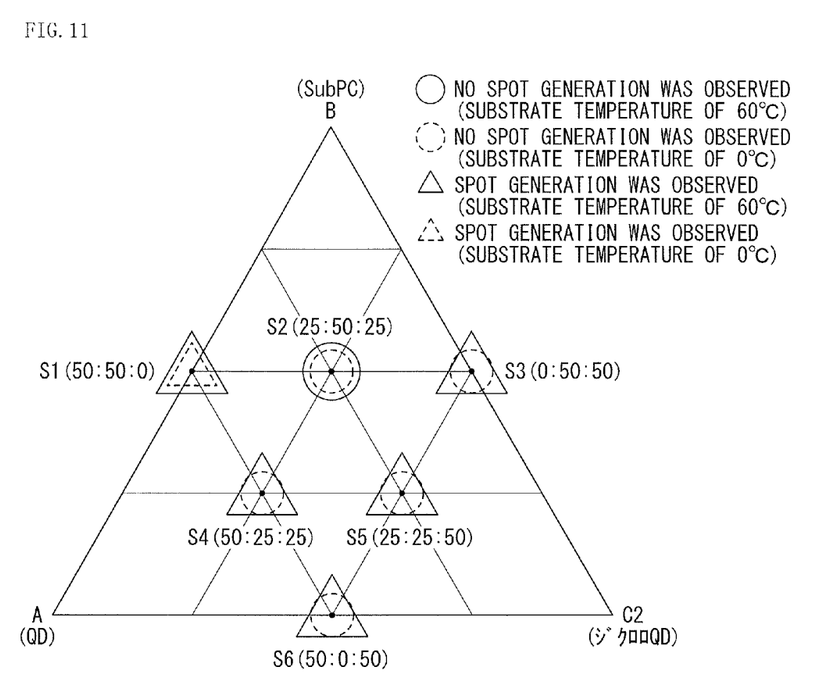
FIG. 11 is a schematic view illustrating an example of a ternary system mixture ratio of organic semiconductors included in a photoelectric conversion layer of a photoelectric conversion device according to a modification example.

FIG. 11 illustrates an example of a ternary system mixture ratio of organic semiconductors (organic semiconductors A, B, and C2) included in the organic layer 13 according to the modification example. In this modification example, the organic layer 13 includes the organic semiconductor A (quinacridone) and the organic semiconductor B (subphthalocyanine) that are similar to those in the above-described embodiment, and the organic semiconductor C2 (dichloroquinacridone) different from the organic semiconductor C1 is added as a derivative of the organic semiconductor A to the organic layer 13. FIG. 11 illustrates the ternary system mixture ratios (A:B:C2) of the organic semiconductors A, B, and C2=s1 (50:50:0), s2 (25:50:25), s3 (0:50:50), s4 (50:25:25), s5 (25:25:50), and s6 (50:0:50), and presence or absence of spot generation of the organic layer 13 in these respective cases. It is to be noted that, as with the above-described embodiment, this is based on results of observing sectional surfaces of the organic layers 13 formed by co-evaporating mixtures of the organic semiconductors A, B, and C2 at the above-described mixture ratios s1 to s6 on a quartz substrate (at substrate temperatures of 60° C. and 0° C.) and then performing high-temperature annealing (at about 250° C. for several minutes) to evaluate the presence or absence of a spot. In each of s1 to s6, a case where spot generation was not observed is indicated by a "circle" mark, and a case where spot generation was observed is indicated by a "triangle" mark. Moreover, these marks are indicated by a solid line in a case of a substrate temperature of 60° C. and are indicated by a broken line in a case of a substrate temperature of 0° C.

Thus, the derivative of the organic semiconductor A (quinacridone) is not limited to the organic semiconductor C1 (dimethylquinacridone) of the above-described embodiment, and the organic semiconductor C2 (dichloroquinacridone) may be used. Moreover, any analog such as a derivative or an isomer of the organic semiconductor A may be used as an aggregation inhibitor for the organic semiconductor A; therefore, the analog of the organic semiconductor A is not limited to the above-described materials, and any of various materials may be used as an additive in a ternary system. Moreover, the organic semiconductors A and B are not limited to a combination of quinacridone and subphthalocyanine exemplified in FIGS. 2 and 11, and any of various combinations of the above-described various p-type and n-type organic semiconductors may be selected.

(Entire Configuration of Solid-State Image Pickup Unit)

Figure 12:
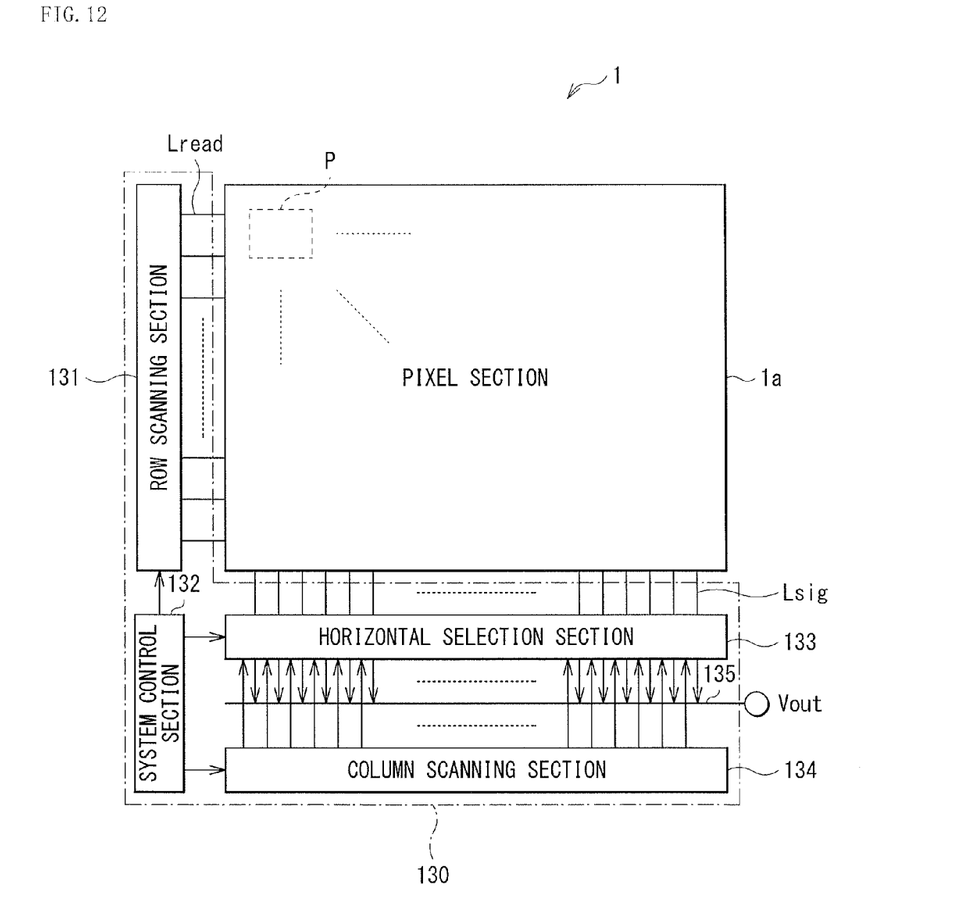
FIG. 12 is a functional block diagram of a solid-state image pickup unit.

FIG. 12 is a functional block diagram of a solid-state image pickup unit (a solid-state image pickup unit 1) using, for each pixel, the photoelectric conversion device described in the above-described embodiment. This solid-state image pickup unit 1 is a CMOS image sensor, and includes a pixel section 1a as an image pickup area and may include a circuit section 130 configured of, for example, a row scanning section 131, a horizontal selection section 133, a column scanning section 134, and a system control section 132. The circuit section 130 may be laminated with a peripheral region of the pixel section 1a or the pixel section 1a, and may be provided in the peripheral region of the pixel section 1a, or may be provided to be laminated with the pixel section 1a (in a region facing the pixel section 1a).

The pixel section 1a may include, for example, a plurality of unit pixels P (corresponding to the photoelectric conversion devices 10) that are two-dimensionally arranged in a matrix form. Respective pixel drive lines Lread (more specifically, row selection lines and reset control lines) may be wired to, for example, respective pixel rows of the unit pixels P, and respective vertical signal lines Lsig may be wired to respective pixel columns of the unit pixels P. Each of the pixel drive lines Lread is configured to transmit a drive signal for signal reading from the pixel. An end of each of the pixel drive lines Lread is connected to an output end corresponding to each row of the row scanning section 131.

The row scanning section 131 is configured of a shift register, an address decoder, and the like, and may be, for example, a pixel drive section that drives the respective pixels P of the pixel section 1a from one row to another. Signals output from the respective pixels P in a pixel row selected and scanned by the row scanning section 131 are supplied to the horizontal selection section 133 through the respective vertical signal lines Lsig. The horizontal selection section 133 is configured of an amplifier, a horizontal selection switch, and the like provided to each of the vertical signal lines Lsig.

The column scanning section 134 is configured of a shift register, an address decoder, and the like, and sequentially drives respective horizontal selection switches of the horizontal selection section 133 while scanning the horizontal selection switches. Signals of the respective pixels transmitted through the respective vertical signal lines Lsig are sequentially transmitted to a horizontal signal line 135 by selection scanning by the column scanning section 134, and are output to outside through the horizontal signal line 135.

The system control section 132 is configured to receive data indicating a clock, an operation mode, or the like supplied from outside, and to output data such as internal information of the solid-state image pickup unit 1. The system control section 132 further includes a timing generator that generates various kinds of timing signals, and performs drive control on the row scanning section 131, the horizontal selection section 133, the column scanning section 134, and the like in response to the various kinds of timing signals generated by the timing generator.

Application Example

Figure 13:
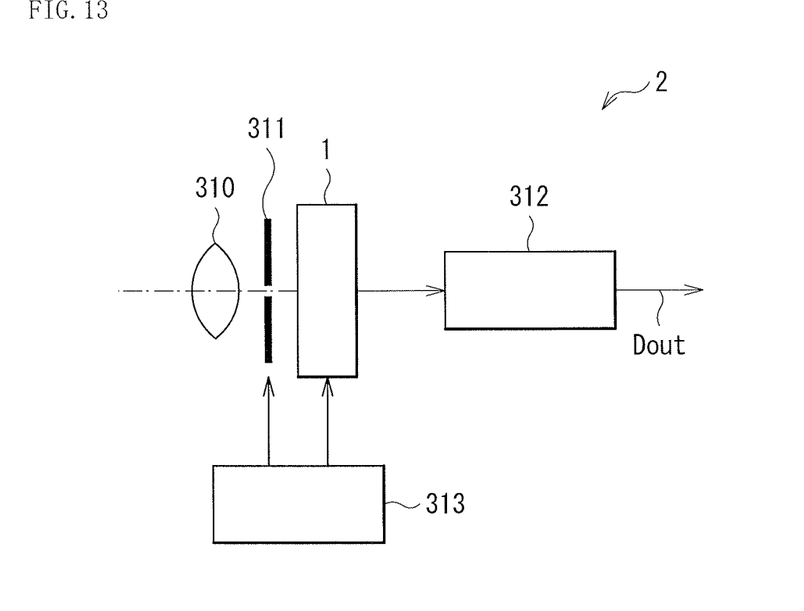
FIG. 13 is a functional block diagram of an electronic apparatus according to an application example.

The above-described solid-state image pickup unit 1 is applicable to all types of electronic apparatuses having an image pickup function, for example, camera systems such as digital still cameras and video cameras, and cellular phones having an image pickup function. FIG. 13 illustrates a schematic configuration of an electronic apparatus 2 (a camera) as an example. The electronic apparatus 2 may be, for example, a video camera capable of taking a still image or a moving image, and includes the solid-state image pickup unit 1, an optical system (an optical lens) 310, a shutter unit 311, a drive section 313 that drives the solid-state image pickup unit 1 and the shutter unit 311, and a signal processing section 312.

The optical system 310 is configured to guide image light (incident light) from a subject to the pixel section 1a of the solid-state image pickup unit 1. This optical system 310 may be configured of a plurality of optical lenses. The shutter unit 311 is configured to control a light irradiation period and a light-shielding period for the solid-state image pickup unit 1. The drive section 313 is configured to control a transfer operation of the solid-state image pickup unit 1 and a shutter operation of the shutter unit 311. The signal processing section 312 is configured to perform various kinds of signal processing on a signal output from the solid-state image pickup unit 1. An image signal Dout that has been subjected to signal processing may be stored in a storage medium such as a memory, or may be output to a monitor or the like.

Although the present disclosure is described referring to the above-described embodiment, the modification examples, and the application example, the present disclosure is not limited thereto, and various modifications are possible. For example, in the above-described embodiment and the like, the (ternary system) organic layer 13 including three kinds of organic semiconductors is exemplified; however, it is only necessary for the organic layer of the present disclosure to include at least the above-described three kinds of organic semiconductors, and the organic layer of the present disclosure may further include another organic semiconductor.

Moreover, it may not be necessary for the photoelectric conversion device of the present disclosure to include all components described in the above-described embodiment and the like, or on the contrary, the photoelectric conversion device of the present disclosure may include any other layer.

It is to be noted that the present disclosure is allowed to have following configurations.

(1) A photoelectric conversion device including:
a photoelectric conversion layer including a first organic semiconductor of a first conductive type and a second organic semiconductor of a second conductive type, and being configured by addition of a third organic semiconductor made of a derivative or an isomer of one of the first and second organic semiconductors; and
first and second electrodes provided with the photoelectric conversion layer in between.

(2) The photoelectric conversion device according to (1), in which the third organic semiconductor is a derivative or an isomer of one with a higher aggregation property of the first and second organic semiconductors.

(3) The photoelectric conversion device according to (1) or (2), in which the photoelectric conversion layer is a co-evaporated film including the first to third organic semiconductors.

(4) The photoelectric conversion device according to (1) or (2), in which the photoelectric conversion layer is a coating film or a printing film including the first to third organic semiconductors.

(5) The photoelectric conversion device according to (1) or (2), in which the photoelectric conversion layer is a laminate film including the first to third organic semiconductors.

(6) A solid-state image pickup unit provided with a plurality of pixels each of which includes a photoelectric conversion device, the photoelectric conversion device including:
a photoelectric conversion layer including a first organic semiconductor of a first conductive type and a second organic semiconductor of a second conductive type, and being configured by addition of a third organic semiconductor made of a derivative or an isomer of one of the first and second organic semiconductors; and
first and second electrodes provided with the photoelectric conversion layer in between.

(7) An electronic apparatus provided with a solid-state image pickup unit, the solid-state image pickup unit including a plurality of pixels each of which includes a photoelectric conversion device, the photoelectric conversion device including:
a photoelectric conversion layer including a first organic semiconductor of a first conductive type and a second organic semiconductor of a second conductive type, and being configured by addition of a third organic semiconductor made of a derivative or an isomer of one of the first and second organic semiconductors; and first and second electrodes provided with the photoelectric conversion layer in between.

The present application claims priority on the basis of Japanese Patent Application No. 2012-247207 filed in the Japan Patent Office on Nov. 9, 2012, the entire content of which is hereby incorporated by reference.

It should be understood by those skilled in the art that various modifications, combinations, sub-combinations, and alterations may occur depending on design requirements and other factors insofar as they are within the scope of the appended claims or the equivalents thereof.

What is claimed is:

1. A photoelectric conversion device comprising:
a photoelectric conversion layer including a first organic semiconductor of a first conductive type and a second organic semiconductor of a second conductive type, and being configured by addition of a third organic semiconductor made of a derivative or an isomer of one of the first and second organic semiconductors; and
first and second electrodes provided with the photoelectric conversion layer in between,
wherein
the first organic semiconductor is a quinacridone derivative,
the second organic semiconductor is one of subphthalocyanine, fullerene or a thiophene derivative, and
the third organic semiconductor is a different quinacridone derivative from the first organic semiconductor.

2. The photoelectric conversion device according to claim 1, wherein the third organic semiconductor is a derivative or an isomer of one with a higher aggregation property of the first and second organic semiconductors.

3. The photoelectric conversion device according to claim 1, wherein the photoelectric conversion layer is a co-evaporated film including the first to third organic semiconductors.

4. The photoelectric conversion device according to claim 1, wherein the photoelectric conversion layer is a coating film or a printing film including the first to third organic semiconductors.

5. The photoelectric conversion device according to claim 1, wherein the photoelectric conversion layer is a laminate film including the first to third organic semiconductors.

6. The photoelectric conversion device according to claim 1, wherein an ionization potential of the first organic semiconductor is smaller than an ionization potential of the second organic semiconductor.

7. The photoelectric conversion device according to claim 1, wherein the first conductive type is a p-type, and the second conductive type is an n-type.

8. The photoelectric conversion device according to claim 1, wherein
the first organic semiconductor is quinacridone,
the second organic semiconductor is subphthalocyanine, and
the third organic semiconductor is dimethylquinacridone.

9. The photoelectric conversion device according to claim 1, wherein
the first organic semiconductor is quinacridone,
the second organic semiconductor is subphthalocyanine, and
the third organic semiconductor is dichloroquinacridone.

10. The photoelectric conversion device according to claim 1, wherein
the second organic semiconductor is subphthalocyanine.

11. The photoelectric conversion device according to claim 1, wherein
the second organic semiconductor is fullerene.

12. The photoelectric conversion device according to claim 1, wherein
the second organic semiconductor is a thiophene derivative.

13. A solid-state image pickup unit provided with a plurality of pixels each of which includes a photoelectric conversion device, the photoelectric conversion device comprising:
a photoelectric conversion layer including a first organic semiconductor of a first conductive type and a second organic semiconductor of a second conductive type, and being configured by addition of a third organic semiconductor made of a derivative or an isomer of one of the first and second organic semiconductors; and
first and second electrodes provided with the photoelectric conversion layer in between,
wherein
the first organic semiconductor is a quinacridone derivative,
the second organic semiconductor is one of subphthalocyanine, fullerene or a thiophene derivative; and
the third organic semiconductor is a different quinacridone derivative from the first organic semiconductor.

14. An electronic apparatus provided with a solid-state image pickup unit, the solid-state image pickup unit including a plurality of pixels each of which includes a photoelectric conversion device, the photoelectric conversion device comprising:
a photoelectric conversion layer including a first organic semiconductor of a first conductive type and a second organic semiconductor of a second conductive type, and being configured by addition of a third organic semiconductor made of a derivative or an isomer of one of the first and second organic semiconductors; and
first and second electrodes provided with the photoelectric conversion layer in between,
wherein
the first organic semiconductor is a quinacridone derivative,
the second organic semiconductor is one of subphthalocyanine, fullerene or a thiophene derivative, and
the third organic semiconductor is a different quinacridone derivative from the first organic semiconductor.

* * * * *